US008232705B2

(12) United States Patent
Tai

(10) Patent No.: US 8,232,705 B2
(45) Date of Patent: Jul. 31, 2012

(54) THERMAL TRANSFER AND ACOUSTIC MATCHING LAYERS FOR ULTRASOUND TRANSDUCER

(75) Inventor: Alan Chi-Chung Tai, Phoenix, AZ (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/833,101

(22) Filed: Jul. 9, 2010

(65) Prior Publication Data

US 2012/0007471 A1 Jan. 12, 2012

(51) Int. Cl.
*H01L 41/083* (2006.01)

(52) U.S. Cl. ........................................ 310/334; 310/335

(58) Field of Classification Search .................. 310/322, 310/334, 335

See application file for complete search history.

(56) References Cited

U.S. PATENT DOCUMENTS

2007/0222339 A1* 9/2007 Lukacs et al. ................. 310/335
2008/0098816 A1* 5/2008 Yamashita et al. .............. 73/596
2008/0238262 A1* 10/2008 Takeuchi et al. .............. 310/346
2008/0262358 A1* 10/2008 Kaminski et al. ............. 600/459
2010/0168581 A1* 7/2010 Knowles et al. .............. 600/459

* cited by examiner

*Primary Examiner* — Derek Rosenau
(74) *Attorney, Agent, or Firm* — McAndrews, Held & Malloy, Ltd.; Jacob Groethe; David Bates

(57) ABSTRACT

Ultrasound transducers and methods of making ultrasound transducers with improved thermal characteristics are provided. An ultrasound transducer can include: a backing, a piezoelectric element attached to the backing, a first matching layer attached to the piezoelectric element, and a second matching layer attached to the first matching layer. The first matching layer can comprise metal and can have a thermal conductivity of about greater than 30 W/mK. The second matching layer can have a thermal conductivity of about 0.5-300 W/mK. The first matching layer can have an acoustic impedance of about 10-20 MRayl, and the second matching layer can have a lower acoustic impedance. The first matching layer can be thicker than the second matching layer. The ultrasound transducer can include a lens and a matching layer disposed between the piezoelectric element and the lens can be configured to conduct heat from the piezoelectric element to the backing.

18 Claims, 7 Drawing Sheets

| MATCHING LAYER | ACOUSTIC IMPEDANCE (MRAYL) | THICKNESS AS A A FUNCTION OF WAVELENGTH λ | THERMAL CONDUCTIVITY (W/MK) |
|---|---|---|---|
| 203 | ABOUT 1.5 - 3 | < ABOUT 0.25 λ | ABOUT 0.5 - 50 |
| 204 | ABOUT 2 - 8 | < ABOUT 0.25 λ | ABOUT 0.5 - 50 |
| 205 | ABOUT 5 - 15 | < ABOUT 0.25 λ | ABOUT 1 - 300 |
| 206 | ABOUT 10 - 20 | < ABOUT 0.22 λ | > ABOUT 30 |

FIG. 2B

ACOUSTIC LAYERS

| FACE PLATE No | MATL NAME | SHEAR VEL. m/sec | LONG VEL m/sec | LONG IMPED. MRayls | LOSS ALPHA dB/cm | LOSS AT F MHz | LOSS N | REL AREA | THICK Lambdas At Fd | THICK mm |
|---|---|---|---|---|---|---|---|---|---|---|
| 1 | Aluminum-bar | 3641.5 | 5150.0 | 13.905 | 0.000 | 1.000 | 1.00 | 1.000 | 0.1726 | 0.2540 |
| 2 | Filled epoxy | 1727.3 | 2450.0 | 6.127 | 5.300 | 1.000 | 1.30 | 1.000 | 0.2000 | 0.1400 |
| 3 | Blank | 1600.4 | 2270.0 | 2.499 | 3.000 | 1.000 | 1.00 | 1.000 | 0.1765 | 0.1145 |

No Backplates
ACOUSTIC LOAD IMPEDANCES: Rear: 3.000 MRayls Front: 1.500 MRayls
ELECTRICAL TERMINATIONS : Transmitter output = 50.0 Ohms Receiver input = 50.0 Ohms
ELECTRICAL MATCHING NETWORK:
1. Coaxial cable 50 Ohms 2.3 m 3. dB/km at 10 MHz, 2 Series L 3.3 uH Plot Type
Waveform & Spectrum Center Freq and Bandwidth

| Level dB | Center Freq MHz | Band Width MHz | Band Width %CF |
|---|---|---|---|
| -6 | 3.490 | 3.503 | 100.39 |
| -20 | 3.697 | 5.033 | 136.15 |
| -40 | 3.804 | 6.393 | 168.07 |

Pulse Width and Level

| Level dB | Width usec |
|---|---|
| -6 | 0.217 |
| -20 | 0.656 |
| -40 | 1.514 |

Pk Ampl = -31.11 dB re 1V/V

Attenuation in Load Medium

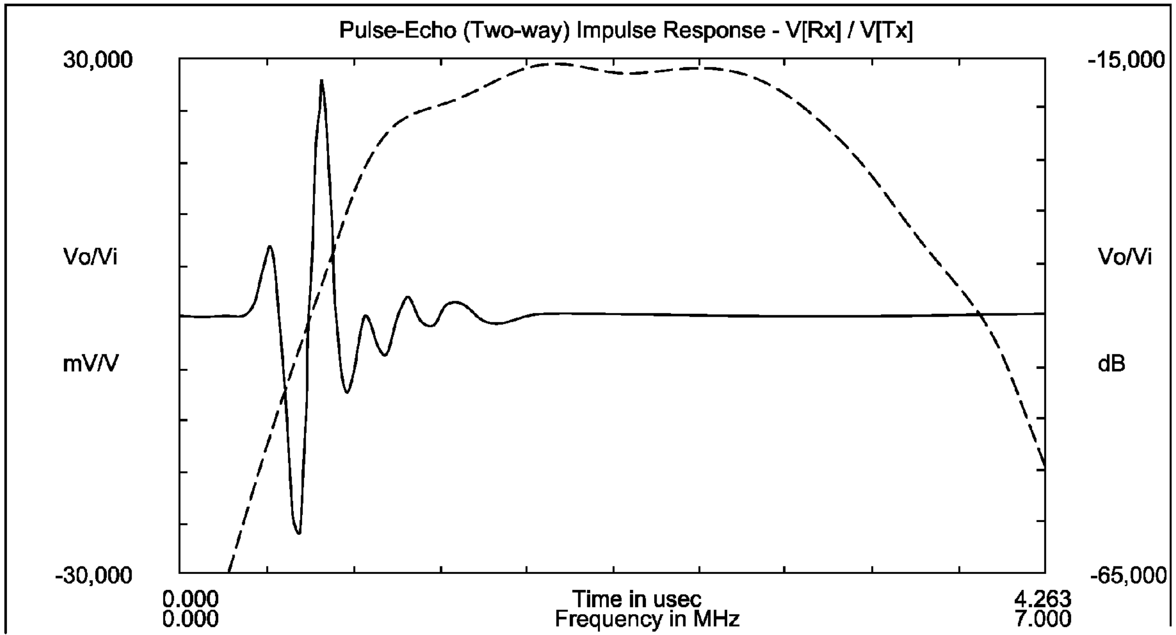

FIG. 7

THERMAL TRANSFER AND ACOUSTIC MATCHING LAYERS FOR ULTRASOUND TRANSDUCER

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Embodiments of the present technology generally relate to ultrasound transducers configured to provide improved thermal characteristics.

As depicted in FIG. 1, conventional ultrasound transducers 100 can be composed of various layers including a lens 102, impedance matching layers 104 and 106, a piezoelectric element 108, backing 110, and electrical elements for connection to an ultrasound system.

Piezoelectric element 108 can convert electrical signals into ultrasound waves to be transmitted toward a target and can also convert received ultrasound waves into electrical signals. Arrows 112 depict ultrasound waves transmitted from and received at transducer 100. The received ultrasound waves can be used by the ultrasound system to create an image of the target.

In order to increase energy out of transducer 100, impedance matching layers 104, 106 are disposed between piezoelectric element 108 and lens 102. Conventionally, optimal impedance matching has been believed to be achieved when matching layers 104, 106 separate piezoelectric element 108 and lens 102 by a distance x of about ¼ to ½ of the desired wavelength of transmitted ultrasound waves at the resonant frequency. Conventional belief is that such a configuration can keep ultrasound waves that were reflected within the matching layers 104, 106 in phase when they exit the matching layers 104, 106.

Transmitting ultrasound waves from transducer 100 can heat lens 102. However, patient contact transducers have a maximum surface temperature of about 40 degrees Celsius in order to avoid patient discomfort and comply with regulatory temperature limits. Thus, lens temperature can be a limiting factor for wave transmission power and transducer performance.

Many known thermal management techniques are focused on the backside of the transducer in order to minimize reflection of ultrasound energy toward the lens. Nonetheless, there is a need for improved ultrasound transducers with improved thermal characteristics.

BRIEF SUMMARY OF THE INVENTION

Embodiments of the present technology generally relate to ultrasound transducers and methods of making ultrasound transducers.

In an embodiment, for example, an ultrasound transducer can include: a backing; a piezoelectric element attached to the backing, the piezoelectric element configured to convert electrical signals into ultrasound waves to be transmitted toward a target, the piezoelectric element configured to convert received ultrasound waves into electrical signals; a first matching layer attached to the piezoelectric element, the first matching layer having a first acoustic impedance and a thermal conductivity of about greater than 30 W/mK; and a second matching layer attached to the first matching layer, the second matching layer having a second acoustic impedance that is lower than the first acoustic impedance.

In an embodiment, for example, the first acoustic impedance is about 10-20 MRayl.

In an embodiment, for example, the first matching layer has a first thickness, and the second matching layer has a second thickness that is less than the first thickness.

In an embodiment, for example, the second matching layer has a thermal conductivity of about 0.5-300 W/mK.

In an embodiment, for example, an ultrasound transducer can further include a third matching layer attached to the second matching layer, the third matching layer having a third acoustic impedance that is lower than the second acoustic impedance.

In an embodiment, for example, an ultrasound transducer can further include a lens, wherein the first and second matching layers are disposed between the piezoelectric element and the lens, and wherein the thickness of each matching layer is less than about ¼ of a desired wavelength of transmitted ultrasound waves at a resonant frequency.

In an embodiment, for example, the first matching layer comprises a metal.

In an embodiment, for example, the first matching layer includes a wing configured to extend beyond an end of the piezoelectric element to the backing, the wing configured to conduct heat from the piezoelectric element to the backing.

In an embodiment, for example, the piezoelectric element includes a plurality of cuts, and wherein the wing is disposed substantially perpendicular to the cuts.

In an embodiment, for example, the piezoelectric element includes a plurality of cuts, and wherein the wing is disposed substantially parallel to the cuts.

In an embodiment, for example, the first matching layer includes a portion configured to extend beyond an end of the piezoelectric element, the portion being connected to a thermally conductive sheet configured to extend to the backing, the portion and the sheet configured to conduct heat from the piezoelectric element to the backing.

In an embodiment, for example, the backing, the piezoelectric element, the first matching layer and the second matching layer are attached by epoxy.

In an embodiment, for example, a method of making an ultrasound transducer can include: attaching a backing to a piezoelectric element, the piezoelectric element configured to convert electrical signals into ultrasound waves to be transmitted toward a target, the piezoelectric element configured to convert received ultrasound waves into electrical signals; attaching a first matching layer to the piezoelectric element, the first matching layer having a first acoustic impedance and a thermal conductivity of about greater than 30 W/mK; and attaching a second matching layer to the first matching layer, the second matching layer having a second acoustic impedance that is lower than the first acoustic impedance.

In an embodiment, for example, a method of making an ultrasound transducer can further include: making a plurality of cuts in the piezoelectric element and the first and second matching layers.

In an embodiment, for example, the first matching layer includes a wing configured to extend beyond an end of the piezoelectric element, and the method can further include: cutting a plurality of notches on a surface of the wing; and folding the wing away from the notches such that the wing extends beyond the end of the piezoelectric element to the backing, the wing configured to conduct heat from the piezoelectric element to the backing.

In an embodiment, for example, the first matching layer includes a portion configured to extend beyond an end of the piezoelectric element, and the method can further include: connecting the portion to a thermally conductive sheet configured to extend to the backing, the portion and the sheet configured to conduct heat from the piezoelectric element to the backing.

In an embodiment, for example, the backing, the piezoelectric element, the first matching layer and the second matching layer are attached using epoxy.

In an embodiment, for example, an ultrasound transducer can include: a backing; a piezoelectric element attached to the backing, the piezoelectric element configured to convert electrical signals into ultrasound waves to be transmitted toward a target, the piezoelectric element configured to convert received ultrasound waves into electrical signals; a lens; and a matching layer disposed between the piezoelectric element and the lens, the matching layer configured to conduct heat from the piezoelectric element to the backing.

BRIEF DESCRIPTION OF THE DRAWINGS

FIG. 2B is a table of matching layer properties for ultrasound transducers used in accordance with embodiments of the present technology.

FIG. 7 depicts computer simulation results for an ultrasound transducer used in accordance with embodiments of the present technology.

Figure 1:
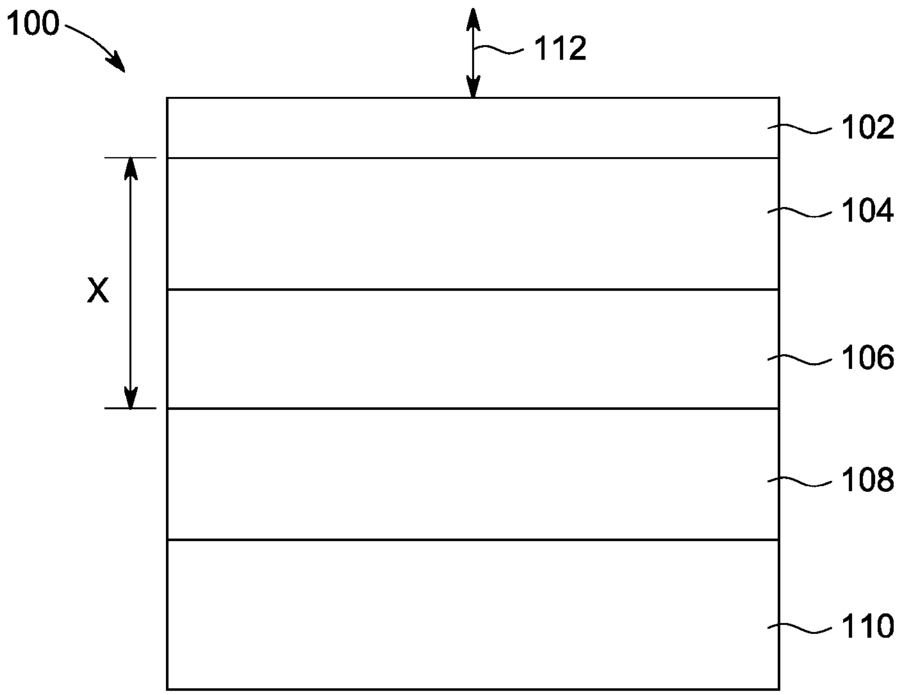
FIG. 1 (PRIOR ART)
FIG. 1 depicts a cross-section of layers of a prior art ultrasound transducer.

The foregoing summary, as well as the following detailed description of certain embodiments, will be better understood when read in conjunction with the appended drawings. For the purpose of illustrating the invention, certain embodiments are shown in the drawings. It should be understood, however, that the present invention is not limited to the arrangements and instrumentality shown in the attached drawings.

DETAILED DESCRIPTION OF CERTAIN EMBODIMENTS

Embodiments of the present technology generally relate to ultrasound transducers configured to provide improved thermal characteristics. In the drawings, like elements are identified with like identifiers.

FIG. 1 depicts a cross-section of layers of a prior art ultrasound transducer 100. Transducer 100 was described in the background, and includes two matching layers 104, 106 disposed between lens 102 and piezoelectric element 108. Matching layers 104, 106 provide a combined distance x between lens 102 and piezoelectric element 108, which distance x is about ¼ to ½ of the desired wavelength of transmitted ultrasound waves at the resonant frequency.

Figure 2A:
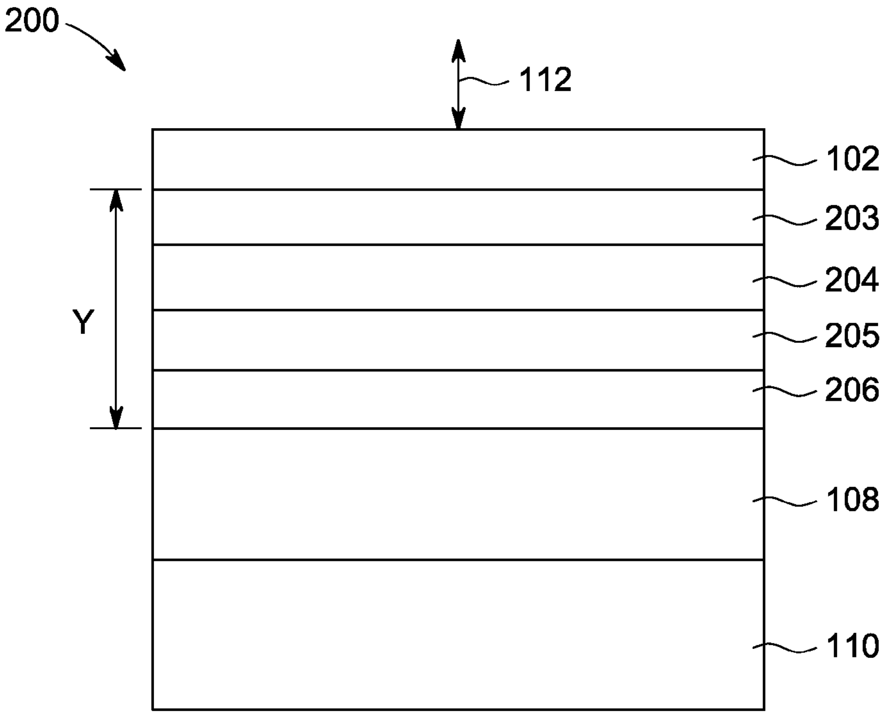
FIG. 2A depicts a cross-section of layers of an ultrasound transducer used in accordance with embodiments of the present technology.

FIG. 2A depicts a cross-section of layers of an ultrasound transducer 200 used in accordance with embodiments of the present technology. Transducer 200 includes lens 102, impedance matching layers 203-206, piezoelectric element 108, backing 110, and electrical elements for connection to an ultrasound system. Backing 110 includes heat sink and thermal management. In certain embodiments, matching layers 203-206, piezoelectric element 108 and lens 102 can be bonded together using epoxy or adhesive materials cured under pressure provided by tooling and/or a press machine, for example.

As with conventional ultrasound transducers, piezoelectric element 108 can convert electrical signals into ultrasound waves to be transmitted toward a target and can also convert received ultrasound waves into electrical signals. Arrows 112 depict ultrasound waves transmitted from and received at transducer 200. The received ultrasound waves can be used by the ultrasound system to create an image of the target.

In order to increase energy out of transducer 100, impedance matching layers 203-206 are disposed between piezoelectric element 108 and lens 102. Matching layers 203-206 separate piezoelectric element 108 and lens 102 by a distance y that can be less than or greater than the distance x (which distance is about ¼ to ½ of the desired wavelength of transmitted ultrasound waves at the resonant frequency).

As depicted in FIG. 1, conventional transducers generally include two matching layers 104, 106. Such matching layers generally comprise epoxy and fillers. It has been found that including a matching layer near the piezoelectric element that has a relatively higher acoustic impedance and a relatively higher thermal conductivity can improve thermal characteristics and/or acoustic properties. Embodiments shown herein depict inventive transducers with three or four matching layers. Nonetheless, embodiments can include as few as two matching layers and greater than four matching layers, such as five or six matching layers, for example.

FIG. 2B is a table of properties of matching layers 203-206 for embodiments of inventive ultrasound transducers. Matching layer 206, which is disposed between piezoelectric element 108 and matching layer 205, can comprise a material with an acoustic impedance of about 10-20 MRayl and thermal conductivity of greater than about 30 W/mK. Matching layer 206 can have a thickness of less than about 0.22λ, where λ is the desired wavelength of transmitted ultrasound waves at the resonant frequency. In certain embodiments, matching layer 206 can comprise a metal(s), such as copper, copper alloy, copper with graphite pattern embedded therein, magnesium, magnesium alloy, semiconductor material such as silicon, aluminum (plate or bar) and/or aluminum alloy, for example. Metals can have a relatively high acoustic impedance such that ultrasound waves travel through the layer at a higher velocity, thereby requiring a thicker matching layer to achieve desired acoustic characteristics.

Matching layer 205, which is disposed between matching layer 206 and matching layer 204, can comprise a material with an acoustic impedance of about 5-15 MRayl and thermal conductivity of about 1-300 W/mK. Matching layer 205 can have a thickness of less than about 0.25λ. In certain embodiments, matching layer 205 can comprise a metal(s), such as copper, copper alloy, copper with graphite pattern embedded therein, magnesium, magnesium alloy, aluminum (plate or bar), aluminum alloy, filled epoxy, glass ceramic, composite ceramic, and/or macor, for example.

Matching layer 204, which is disposed between matching layer 205 and matching layer 203, can comprise a material with an acoustic impedance of about 2-8 MRayl and thermal conductivity of about 0.5-50 W/mK. Matching layer 204 can have a thickness of less than about 0.25λ. In certain embodiments, matching layer 204 can comprise a non-metal, such as an epoxy with fillers, such as silica fillers, for example. In certain embodiments, matching layer 204 can comprise a graphite type material, for example. Non-metals, such as an epoxy with fillers can have a relatively low acoustic impedance such that ultrasound waves travel through the layer at a lower velocity, thereby requiring a thinner matching layer to achieve desired acoustic characteristics.

Matching layer 203, which is disposed between matching layer 204 and lens 102, can comprise a material with an acoustic impedance of about 1.5-3 MRayl and thermal conductivity of about 0.5-50 W/mK. Matching layer 203 can have a thickness of less than about 0.25λ. In certain embodiments, matching layer 203 can comprise a non-metal, such as plastic and/or an epoxy with fillers, such as silica fillers, for example.

In an embodiment, acoustic impedance of matching layers 203-206 decreases as the matching layers 203-206 increase in distance from piezoelectric element 108. That is, matching layer 206 can have a higher acoustic impedance than matching layer 205, matching layer 205 can have a higher acoustic impedance than matching layer 204, and matching layer 204 can have a higher acoustic impedance than matching layer 203. It has been found that providing three or more matching layers with acoustic impedances that decrease in this manner can provide improved acoustic properties, such as increased sensitivity and/or increased border bandwidth, for example. Such improved acoustic properties can improve detection of structures in a target, such as a human body, for example.

In an embodiment, thermal conductivity of matching layers 205, 206 is greater than thermal conductivity of matching layers 203, 204. It has been found that disposing a matching layer with a relatively high thermal conductivity (such as matching layers 205 and/or 206, for example) near piezoelectric element 108 can provide for improved thermal characteristics. For example, such matching layers can dissipate heat generated by piezoelectric element 108 more readily than matching layers of lower thermal conductivity such as matching layers 203 and 204, for example.

Figure 3:
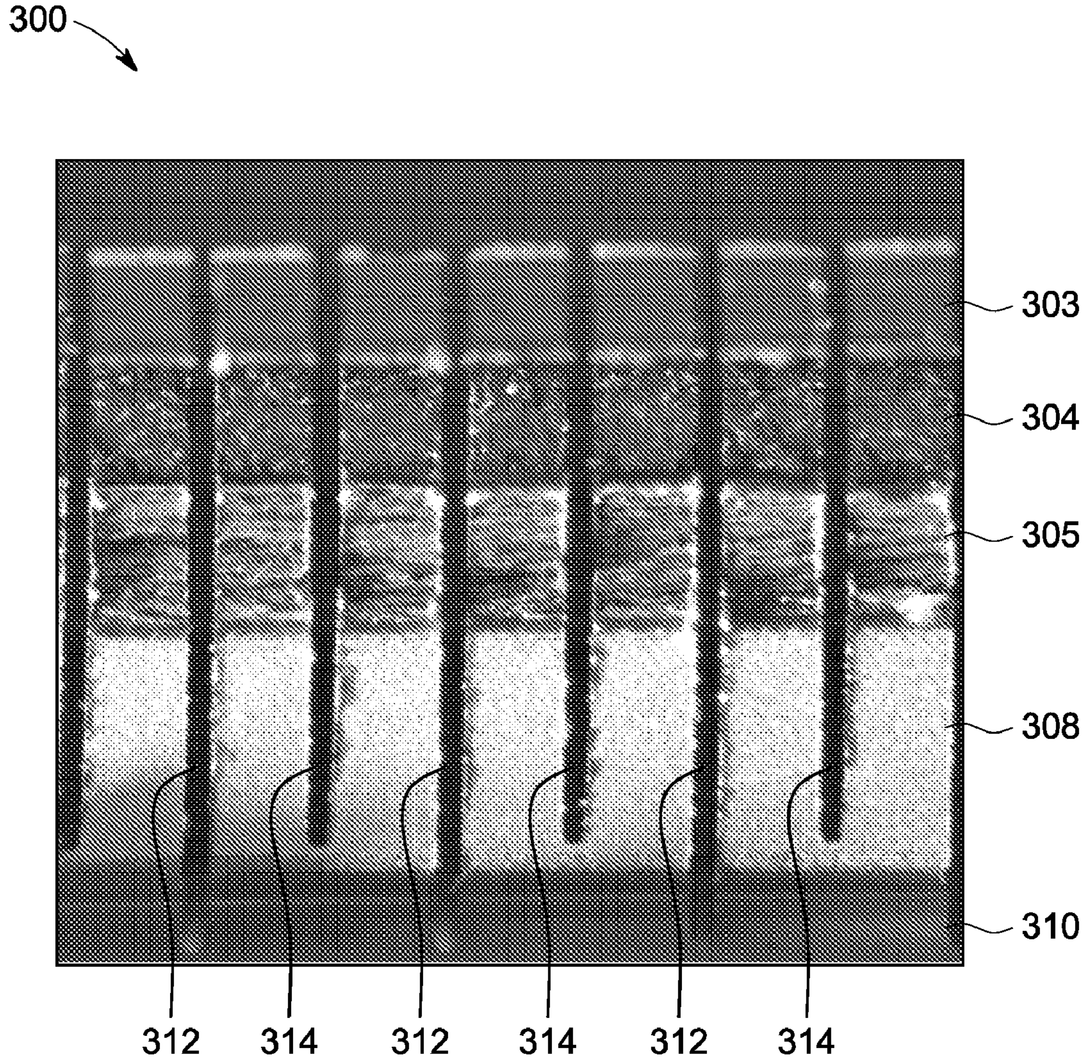
FIG. 3 depicts a cross-section of layers of an ultrasound transducer used in accordance with embodiments of the present technology.

FIG. 3 depicts a cross-section of layers of an ultrasound transducer 300 used in accordance with embodiments of the present technology. Transducer 300 includes a first impedance matching layer 303, a second impedance matching layer 304, a third impedance matching layer 305, piezoelectric element 308, and backing 310. The depicted layers include major cuts 312 and minor cuts 314. Major cuts 312 extend through matching layers 303-305, through piezoelectric element 308, and into backing 310. Major cuts 312 can provide electrical separation between portions of piezoelectric element 308. Minor cuts 314 extend through matching layers 303-305 and partially through piezoelectric element 308. Minor cuts do not extend all the way through piezoelectric element 308, and do not extend into backing 310. Minor cuts 314 do not provide electrical separation between portions of piezoelectric element 308. Minor cuts 314 can improve acoustic performance, for example, by damping horizontal vibration between adjacent portions of the layers. In certain embodiments, cuts can be provided with a cut depth to cut width ratio of about 30 to 1. In certain embodiments, major cuts can be provided with a cut depth of about 1.282 millimeters and minor cuts can be provided with a cut depth of about 1.085 millimeters, both types of cuts being provided with a cut width of about 0.045 millimeters, for example. In certain embodiments, cuts can be provided with a cut width of about 0.02 to 0.045 millimeters, for example. It has been found that minimizing thickness of matching layers 203-206 can provide improved acoustic performance by allowing dicing of the transducer layers as depicted in FIG. 3. It has also been found that minimizing thickness of matching layers 203-206 can make dicing possible with a cut depth to cut width ratio of less than 30 to 1. Using current dicing technology, such as dicing using a dicing saw, it is difficult to obtain a cut depth to cut width ratio that is greater than 30 to 1. Cuts can be made in transducer layers using lasers or other known methods, for example.

Figure 4:
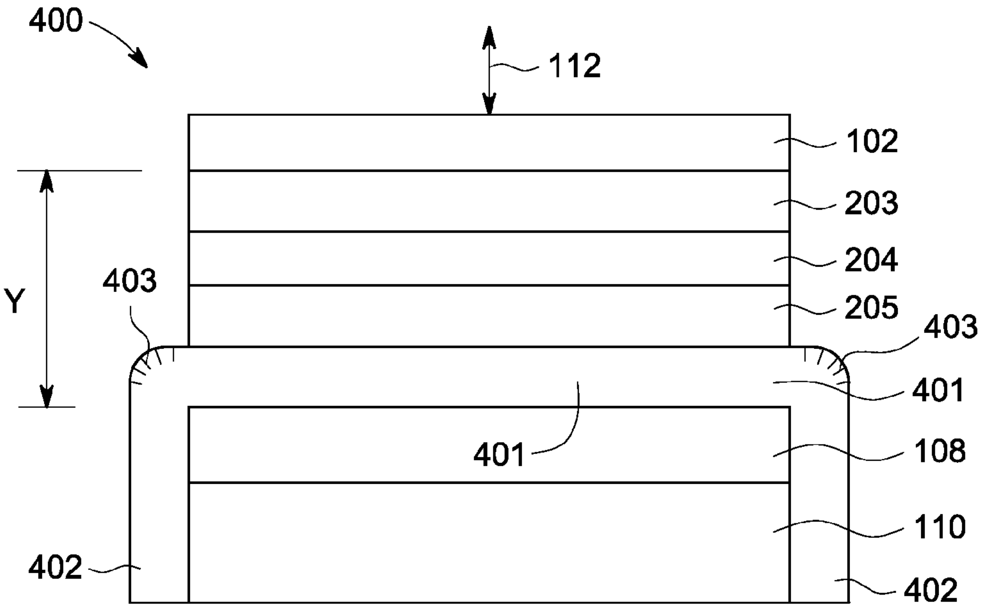
FIG. 4 depicts a cross-section of layers of an ultrasound transducer used in accordance with embodiments of the present technology.

FIG. 4 depicts a cross-section of layers of an ultrasound transducer 400 used in accordance with embodiments of the present technology. Transducer 400 is configured similar to transducer 200 depicted in FIG. 2A. However, transducer 400 includes matching layer 401 in place of matching layer 206. Matching layer 401 is disposed between piezoelectric element 108 and matching layer 205, and can comprise a material and thickness similar to matching layer 206 depicted in FIG. 2A. Matching layer 401 includes wings 402 that extend beyond the ends of piezoelectric element 108 to backing 110.

Wings 402 can be formed by providing matching layer 401 such that it extends beyond the ends of piezoelectric element 108. A plurality of notches 403 can be provided in a surface of matching layer 401, and the portions of matching layer 401 that extend beyond the ends of piezoelectric element 108 can be folded away from notches 403 toward piezoelectric element 108 and backing 110 such that the notches 403 are disposed at and/or around outer elbows of the folds as shown in FIG. 4. The folding operation can be complete once wings 402 are provided about the ends of piezoelectric element 108 and backing 110.

Wings 402 are configured to conduct heat from piezoelectric element 108 to a heat sink and/or thermal management at backing 110. The relatively high thermal conductivity of matching layer 401 and wings 402 can aid in the desired heat transfer toward the backing 110 of transducer 400, and away from lens 102. Wings 402 can also form a ground for transducer 400 by connecting to the appropriate grounding circuit such as a flexible circuit that are usually placed between piezoelectric element 108 and backing 110. Wings 402 can also act as an electrical shielding for the transducer 400.

Figure 5:
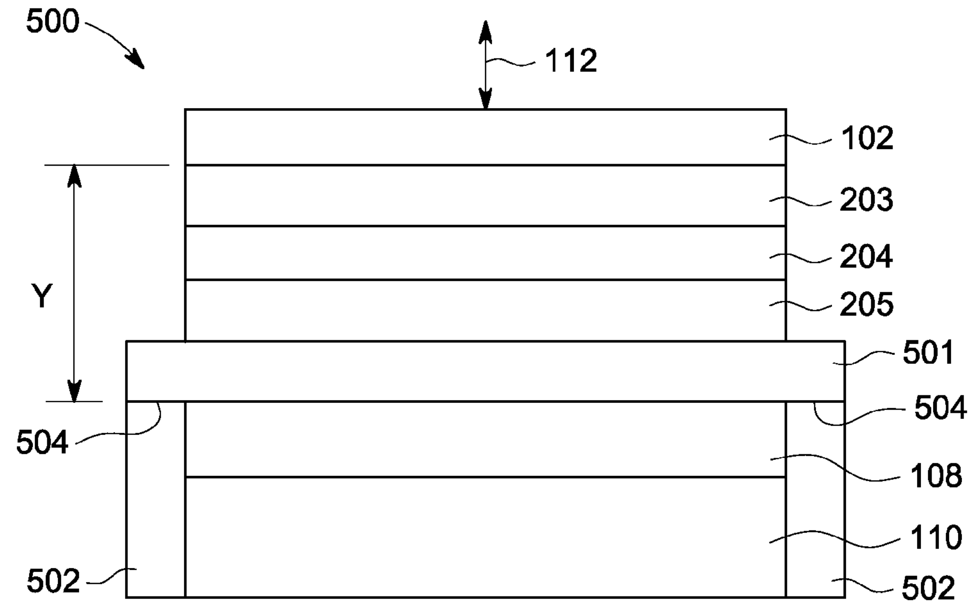
FIG. 5 depicts a cross-section of layers of an ultrasound transducer used in accordance with embodiments of the present technology.

FIG. 5 depicts a cross-section of layers of an ultrasound transducer 500 used in accordance with embodiments of the present technology. Transducer 500 is configured similar to transducer 200 depicted in FIG. 2A. However, transducer 500 includes matching layer 501 in place of matching layer 206. Matching layer 501 is disposed between piezoelectric element 108 and matching layer 205, and can comprise a material and thickness similar to matching layer 206 depicted in FIG. 2A. Matching layer 501 extends beyond the ends of piezoelectric element 108. For example, in an embodiment, matching layer 501 can extend beyond ends of piezoelectric element 108 by about one millimeter or less. Attached to the extended portions of matching layer 501 are sheets 502 that extend over ends of piezoelectric element 108 to backing 110. Sheets 502 can be attached to matching layer 501 using thermally conductive epoxy 504. Sheets 502 comprise material of relatively high thermal conductivity, such as the same material as matching layer 501, graphite and/or thermally conductive epoxy, for example. Sheets 502 are configured to conduct heat from piezoelectric element 108 to a heat sink and/or thermal management at backing 110. The relatively high thermal conductivity of matching layer 501 and sheets 502 can aid in the desired heat transfer toward the backing 110 of transducer 500, and away from lens 102.

Figure 6:
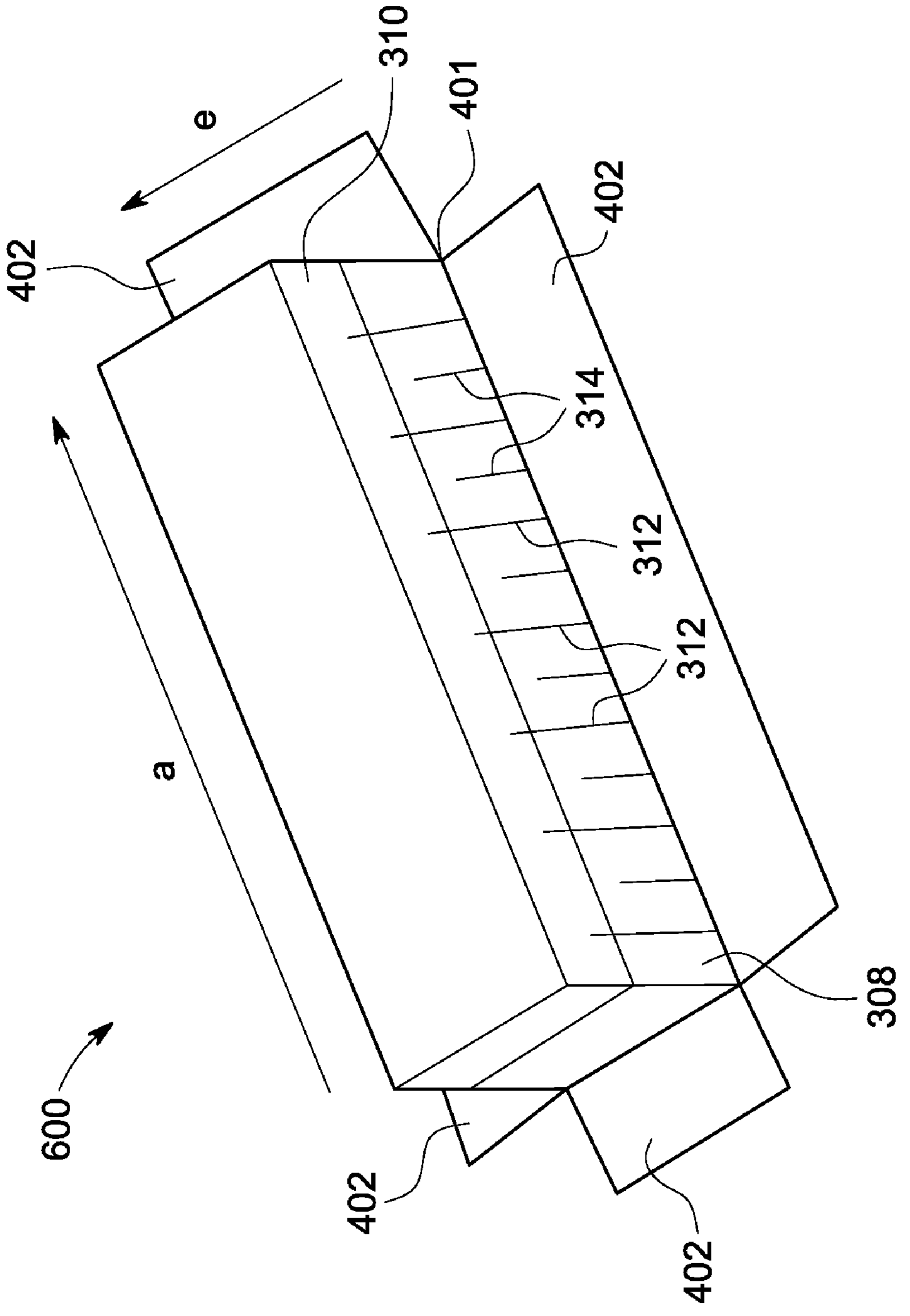
FIG. 6 depicts a perspective view of layers of an ultrasound transducer used in accordance with embodiments of the present technology.

FIG. 6 depicts a perspective view of an ultrasound transducer 600 used in accordance with embodiments of the present technology. Transducer 600 includes an impedance matching layer 401 with wings 402, piezoelectric element 308, and backing 310. Other impedance matching layers and lens are not depicted in FIG. 6. The depicted layers include major cuts 312 and minor cuts 314, which cuts are substantially perpendicular to azimuth direction (a) and substantially parallel to elevation direction (e). Major cuts 312 extend through matching layers, through piezoelectric element 308, and into backing 310. Minor cuts 314 extend through matching layers and partially through piezoelectric element 308. Minor cuts do not extend all the way through piezoelectric element 308, and do not extend into backing 310. Wings 402 are disposed about four sides of transducer 600 and would be folded toward piezoelectric element 308 and backing 310 such that wings 402 could conduct heat from piezoelectric element 308 to a heat sink and/or thermal management at backing 110. In other embodiments, wings 402 may be provided about one, two, three or four sides of a transducer. For example, in certain embodiments, wings 402 may only be provided along two opposing sides of a transducer, such that wings are disposed substantially perpendicular to cuts 312 and 314. In such embodiments, wings 402 extend along the azimuth direction (a) and not the elevation direction (e).

FIG. 7 depicts computer simulation results for an ultrasound transducer used in accordance with embodiments of the present technology. FIG. 7 depicts the results of a simulation study for a 3.5 MHz one-dimensional linear array transducer with three matching layers. The matching layer closest to the piezoelectric element (the first matching layer) comprises aluminum bar with an acoustic impedance of 13.9 MRayl. The second matching layer comprises filled epoxy with an acoustic impedance of 6.127 MRayl. The third matching layer comprises an undefined substance with an acoustic impedance of 2.499 MRayl (which could be plastic and/or an epoxy with fillers, such as silica fillers, for example). Given these acoustic impedances, the simulation indicates that the layers can have respective thicknesses of 0.2540 millimeters (aluminum bar) 0.1400 millimeters (filled epoxy), 0.1145 millimeters (undefined material). The computer simulation demonstrates that the distance from the inner matching layer to the outer matching layer (such as the distance y from matching layer 206 to 203 as depicted in FIG. 2) can be thinner than the matching layers in conventional transducers, such as the those depicted in FIG. 1 that can have a matching layer thickness of about ¼ the desired wavelength of transmitted ultrasound waves at the resonant frequency. Such simulations may use a KLM model, a Mason Model, and/or finite element simulation, for example, to determine desired characteristics.

Simulation studies can be used to optimize matching layer characteristics such that matching layers with desired acoustic impedance and thermal conductivity are provided with minimal thickness, thereby allowing cutting operations to be performed more effectively.

Figure 8:
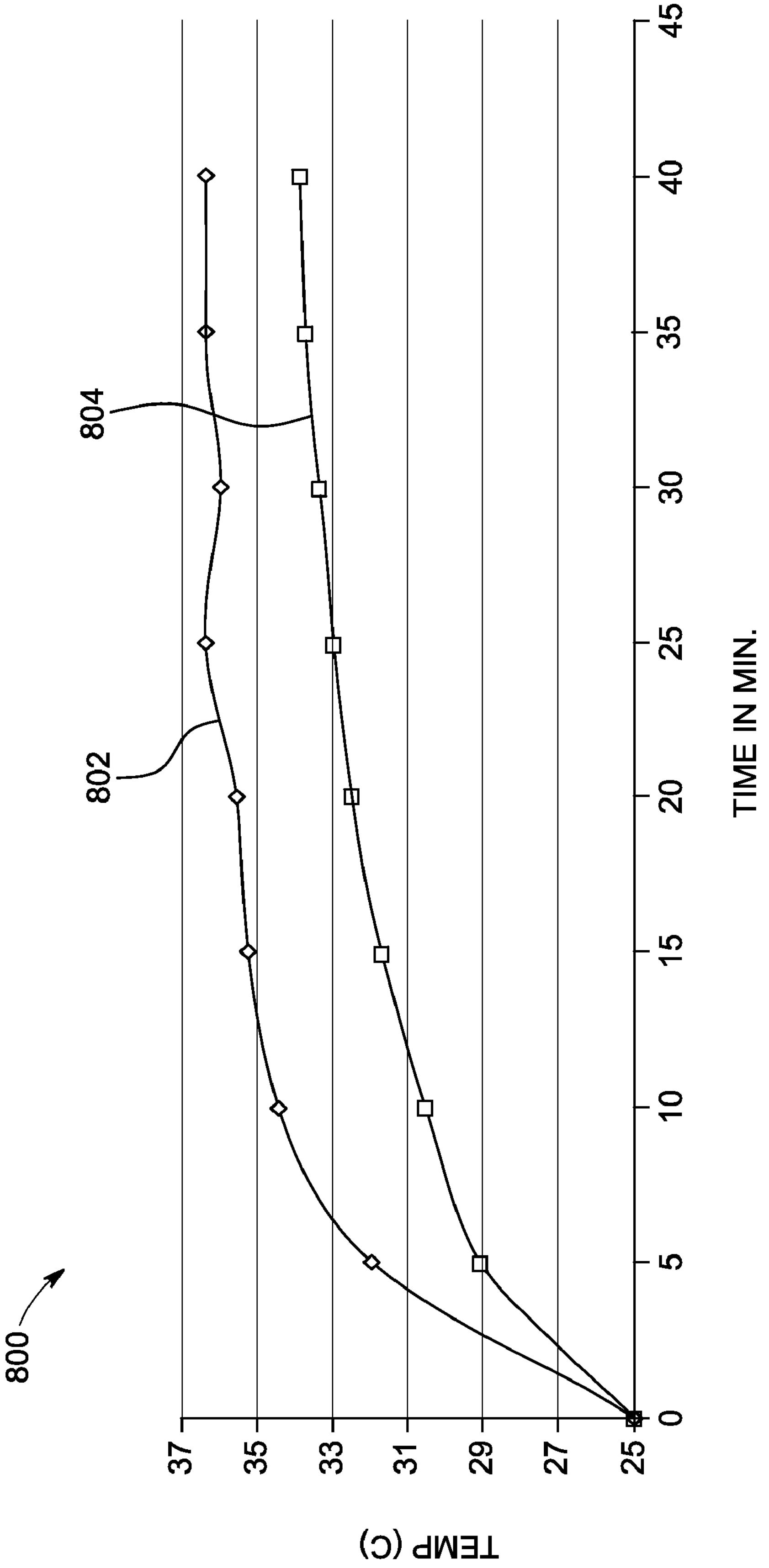
FIG. 8 is a graph depicting experimental results of temperature measurements at the lens surface for a conventional transducer and a transducer built in accordance with an embodiment of the present technology.

FIG. 8 is a graph 800 depicting experimental results of temperature measurements at the lens surface for a conventional transducer and a transducer built in accordance with an embodiment of the present technology. The graph plots temperature at the lens surface vs. time. The temperature measurements for the conventional transducer are indicated by line 802 and the temperature measurements for the transducer built in accordance with an embodiment of the present technology are indicted by line 804. During the experiment, both transducers were connected to an ultrasound system under the same conditions and settings. The transducer built in accordance with an embodiment of the present technology maintained a lens surface temperature that was about 3 to 4 degrees Celsius cooler than the conventional transducer over a 40 minute period.

In certain embodiments, the techniques described herein can be applied in connection with one-dimensional linear array transducers, two-dimensional transducers and/or annular array transducers. In certain embodiments, the techniques described herein can be applied in connection with a transducer of any geometry.

Applying the techniques herein can provide a technical effect of improving acoustic properties and/or thermal characteristics. For example, directing heat away from a transducer lens can allow the transducer to be used at increased power levels, thereby improving signal quality and image quality.

The inventions described herein extend not only to the transducers described herein, but also to methods of making such transducers.

While the inventions have been described with reference to embodiments, it will be understood by those skilled in the art that various changes may be made and equivalents may be substituted without departing from the scope of the inventions. In addition, many modifications may be made to adapt a particular situation or material to the teachings of the inventions without departing from their scope. Therefore, it is intended that the inventions not be limited to the particular embodiments disclosed, but that the inventions will include all embodiments falling within the scope of the appended claims.

The invention claimed is:

1. An ultrasound transducer comprising:

a backing;

a piezoelectric element attached to the backing, the piezoelectric element configured to convert electrical signals into ultrasound waves to be transmitted toward a target, the piezoelectric element configured to convert received ultrasound waves into electrical signals;

a first matching layer attached to the piezoelectric element, the first matching layer having a first acoustic impedance and a thermal conductivity of greater than 30 W/mK, the first matching layer comprising a wing configured to extend beyond an end of the piezoelectric element to the backing, the wing configured to conduct heat from the piezoelectric element to at least one of a heat sink and thermal management at the backing; and a second matching layer attached to the first matching layer, the second matching layer having a second acoustic impedance that is lower than the first acoustic impedance.

2. The ultrasound transducer of claim 1, wherein the first acoustic impedance is about 10-20 MRayl.

3. The ultrasound transducer of claim 1, wherein the first matching layer has a first thickness, and wherein the second matching layer has a second thickness that is less than the first thickness.

4. The ultrasound transducer of claim 1, wherein the second matching layer has a thermal conductivity of about 0.5-300 W/mK.

5. The ultrasound transducer of claim 1, further comprising:

a third matching layer attached to the second matching layer, the third matching layer having a third acoustic impedance that is lower than the second acoustic impedance.

6. The ultrasound transducer of claim 1, further comprising:

a lens, wherein the first and second matching layers are disposed between the piezoelectric element and the lens, and wherein the thickness of each matching layer is less than about ¼ of a desired wavelength of transmitted ultrasound waves at a resonant frequency.

7. The ultrasound transducer of claim 1, wherein the first matching layer comprises a metal.

8. The ultrasound transducer of claim 1, wherein the piezoelectric element includes a plurality of cuts, and wherein the wing is disposed substantially perpendicular to the cuts.

9. The ultrasound transducer of claim 1, wherein the piezoelectric element includes a plurality of cuts, and wherein the wing is disposed substantially parallel to the cuts.

10. The ultrasound transducer of claim 1, wherein the first matching layer includes a portion configured to extend beyond an end of the piezoelectric element, the portion being connected to a thermally conductive sheet configured to extend to the backing, the portion and the sheet configured to conduct heat from the piezoelectric element to the backing.

11. The ultrasound transducer of claim 1, wherein the backing, the piezoelectric element, the first matching layer and the second matching layer are attached by epoxy.

12. A method of making an ultrasound transducer comprising:

attaching a backing to a piezoelectric element, the piezoelectric element configured to convert electrical signals into ultrasound waves to be transmitted toward a target, the piezoelectric element configured to convert received ultrasound waves into electrical signals;

attaching a first matching layer to the piezoelectric element, the first matching layer having a first acoustic impedance and a thermal conductivity of about greater than 30 W/mK, the first matching layer comprising a wing configured to extend beyond an end of the piezoelectric element to the backing, the wing configured to conduct heat from the piezoelectric element to at least one of a heat sink and thermal management at the backing; and attaching a second matching layer to the first matching layer, the second matching layer having a second acoustic impedance that is lower than the first acoustic impedance.

13. The method of claim 12, further comprising:

making a plurality of cuts in the piezoelectric element and the first and second matching layers.

14. The method of claim 12, further comprising:

cutting a plurality of notches on a surface of the wing; and folding the wing away from the notches such that the wing extends beyond the end of the piezoelectric element to the backing.

15. The method of claim 12, wherein the first matching layer includes a portion configured to extend beyond an end of the piezoelectric element, the method further comprising:

connecting the portion to a thermally conductive sheet configured to extend to the backing, the portion and the sheet configured to conduct heat from the piezoelectric element to the backing.

16. The method of claim 12, wherein the backing, the piezoelectric element, the first matching layer and the second matching layer are attached using epoxy.

17. An ultrasound transducer comprising:

a backing;

a piezoelectric element attached to the backing, the piezoelectric element configured to convert electrical signals into ultrasound waves to be transmitted toward a target, the piezoelectric element configured to convert received ultrasound waves into electrical signals;

a lens; and a matching layer disposed between the piezoelectric element and the lens, the matching layer configured to conduct heat from the piezoelectric element to the backing, the matching layer comprising a wing configured to extend beyond an end of the piezoelectric element to the backing, the wing configured to conduct heat from the piezoelectric element to at least one of a heat sink and thermal management at the backing.

18. The ultrasound transducer of claim 17, wherein the matching layer has a thermal conductivity of greater than 30 W/mK.

* * * * *